United States Patent [19]

Motozima et al.

[11] Patent Number: 4,910,170

[45] Date of Patent: Mar. 20, 1990

[54] METHOD OF MANUFACTURING SEMICONDUCTOR DEVICE

[75] Inventors: Toshiyo Motozima, Yokohama; Shin-ichi Taka; Jiro Oshima, both of Kawasaki, all of Japan

[73] Assignee: Kabushiki Kaisha Toshiba, Kawasaki, Japan

[21] Appl. No.: 159,280

[22] Filed: Feb. 23, 1988

[30] Foreign Application Priority Data

Feb. 24, 1987 [JP] Japan .................................. 62-39027

[51] Int. Cl.[4] ......................................... H01L 21/283
[52] U.S. Cl. ..................................... 437/228; 437/31; 437/238; 437/187; 357/34
[58] Field of Search ............... 437/228, 238, 239, 225, 437/31, 32, 33, 241, 187; 357/34, 35, 594; 156/643, 653; 148/DIG. 10, DIG. 11

[56] References Cited

U.S. PATENT DOCUMENTS 4,689,869  9/1987  Jambatkar ............................. 437/44
4,696,097  9/1987  McLaughlin ....................... 437/228
4,798,928  7/1988  Goth et al. ........................... 437/228
4,799,990  1/1989  Kerbaugh ........................... 437/228

OTHER PUBLICATIONS

Japanese Patent Disclosure (Kokai) No. 61-102752, Itoh (transliterated) May 21, 1986.

Primary Examiner—Brian E. Hearn
Assistant Examiner—Kevin McAndrews
Attorney, Agent, or Firm—Finnegan, Henderson, Farabow, Garrett and Dunner

[57] ABSTRACT

In the invention, the width of the emitter contact layer is determined in accordance with the width of a first side wall, and the junction distance between a base contact layer and the emitter contact layer is determined in accordance with the width of a second side wall. The junction distance between the emitter contact layer and the base contact layer can be decreased, no extra high-temperature annealing such as thermal oxidation is needed, and the diffusion profile can be controlled to be shallow.

11 Claims, 6 Drawing Sheets

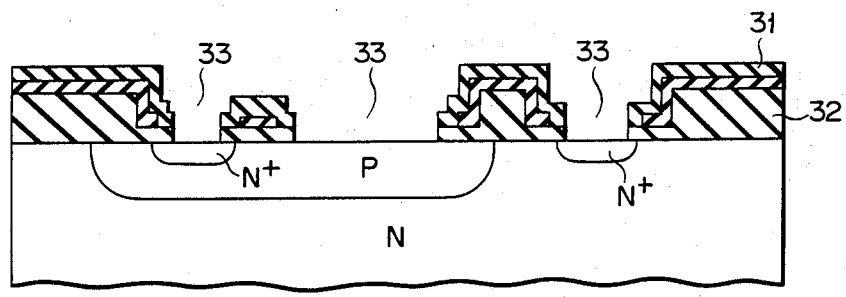
F I G. 1
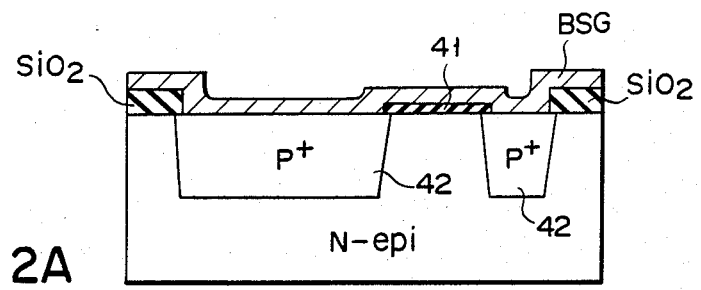
F I G. 2A
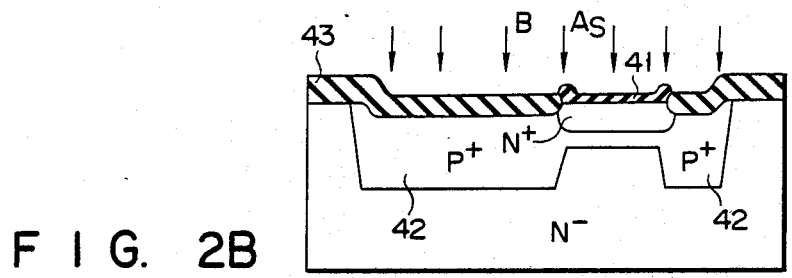
F I G. 2B
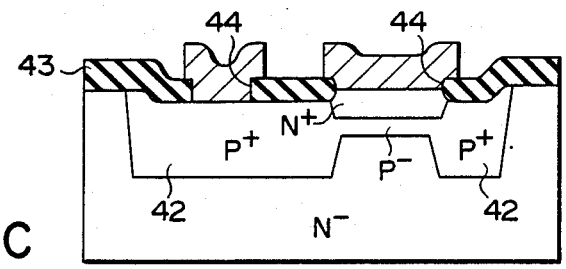
F I G. 2C

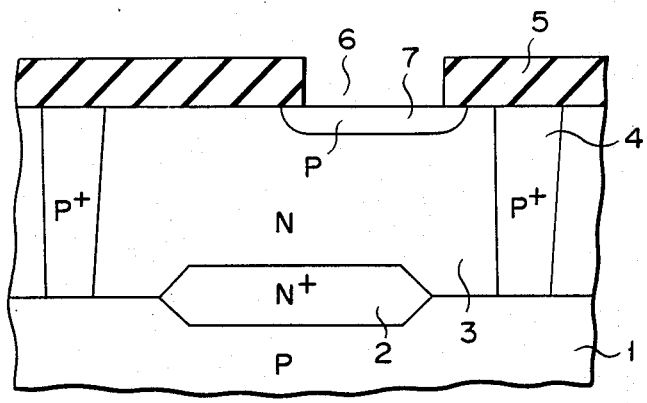
F I G. 5A
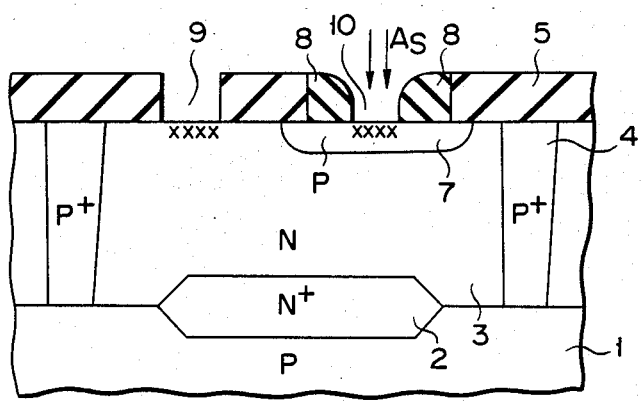
F I G. 5B
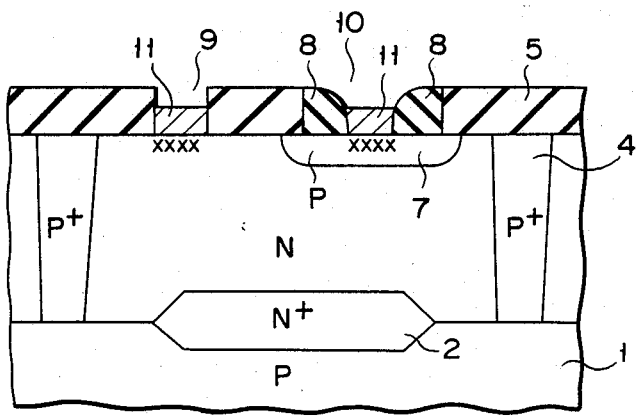
F I G. 5C

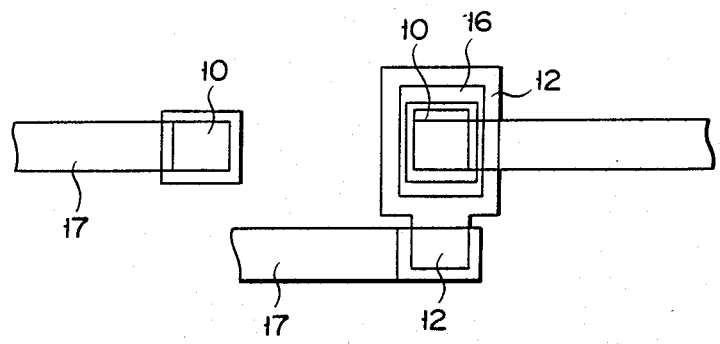
F I G. 6

METHOD OF MANUFACTURING SEMICONDUCTOR DEVICE

BACKGROUND OF THE INVENTION

1. Field of the Invention.

The present invention relates to a method of manufacturing a semiconductor device wherein a junction distance between two semiconductor regions can be decreased.

2. Description of the related art.

In a semiconductor device such as a bipolar transistor and a memory, a junction distance between adjacent semiconductor regions must be decreased to decrease a junction resistance, or the depth of each semiconductor region must be decreased in order to enable a high-speed operation.

A junction distance is a distance between an emitter and a base in the case of a bipolar transistor. The depth of a semiconductor region is the thickness of a semiconductor region such as an emitter.

In order to decrease the junction distance, the following methods are available:

(1) According to a first method, silicon oxide film 32 is washed out by using patterned silicon nitride film 31 as a mask, thereby forming contact hole 33, as shown in FIG. 1.

(2) FIGS. 2A to 2C show the process of a second method.

According to the second method boron in a Borosilicate Glass (BSG) is thermally diffused by using patterned silicon nitride film 41 as a mask, thereby forming p+-type layer 42 (FIG. 2A).

LOCOS oxide film 43 is formed by using silicon nitride film 41 as a mask. Arsenic and boron are ion-implanted and thermally diffused to form a emitter region as a n+-type layer, base region as an p−-type layer (FIG. 2B).

Finally, LOCOS oxide film 43 is selectively etched and silicon nitride film 41 is washed out to form contact hole 44 (FIG. 2C).

(3) FIGS. 3A to 3C show a third method. According to the third method, prospective contact hole 51 is formed by patterning, and diffusion layer 52 is formed. The resultant hole is used as contact hole 51.

(4) FIG. 4 shows a fourth method. According to the fourth method, arsenic-doped polisilicon layer 61 and boron-doped polisilicon layer 63 also serving as a diffusion source is used as wirings of an emitter and a base. A junction distance is determined by oxide film 62 sandwiched between polisilicon layers 61 and 63.

However, the conventional methods described above have the following problems:

(1) With the method shown in FIG. 1, since the size of contact hole 33 is determined by patterning precision of silicon nitride film 31, a decrease in junction distance is limited.

(2) With the method shown in FIGS. 2A to 2C, since the junction distance is determined by LOCOS oxide film 43, the junction resistance can be greatly reduced. However, a defect in the edge of film 43 adversely affects the element characteristics. Oxidation as a high-temperature annealing undesirably changes the diffusion profile. In addition, ion implantation through silicon nitride film 41 changes the film quality of film 41.

(3) With the method shown in FIGS. 3A to 3C, diffusion layer 52 is formed by ion implantation into a resist block on a silicon substrate. Therefore, it is difficult to completely remove the photoresist after ion implantation, and the element characteristics and reliability are thus degraded.

(4) With the method shown in FIG. 4, it is difficult to etch polisilicon layer 63 on the silicon substrate. This leads to a degradation in the interface between the substrate and electrode.

As described above, with the conventional methods of manufacturing a semiconductor wherein a junction distance between semiconductor regions is decreased, a sufficiently small junction distance cannot be set. Even if it can be set, element characteristics are degraded.

SUMMARY OF THE INVENTION

It is an object of the present invention to provide a method of manufacturing a semiconductor device wherein a sufficiently small junction distance can be set between semiconductor regions without degrading element characteristics.

According to the present invention, a first side wall is formed on the side wall of a first groove formed in a first film made of a material different from that of the first side wall. Then, a second film is formed in a second groove defined by the first side wall.

Subsequently, the first side wall is removed, and a second side wall is formed in a third groove defined by the first and second films.

Finally, a third film is formed in a fourth groove defined by the second side wall.

During the above process, a first semiconductor region is provided under the second film, and a second semiconductor region is provided under the third film. The junction distance between the two semiconductor regions is controlled in accordance with the width of the second side wall. It is easy to control the width of the side wall to a small value. With the method of manufacturing a semiconductor device according to the present invention, the junction distance between two semiconductor regions can be decreased.

BRIEF DESCRIPTION OF THE DRAWINGS

FIG. 1 is a sectional view of a semiconductor device manufactured in accordance with a conventional method of manufacturing a semiconductor device;

FIGS. 2A to 2C show the process of another conventional method of manufacturing a semiconductor device;

FIGS. 5A to 5I show the process of a method of manufacturing a semiconductor device according to the present invention; and FIG. 6 is a partially enlarged plan view of a semiconductor device manufactured by the process shown in FIGS. 5A to 5I of the method of manufacturing a semiconductor according to the present invention.

DETAILED DESCRIPTION OF THE PREFERRED EMBODIMENT

Figure 3A:
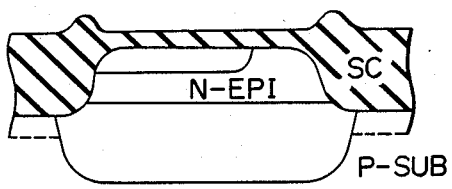
FIGS. 3A to 3C show the process of still another conventional method of manufacturing a semiconductor device.
Figure 3B:
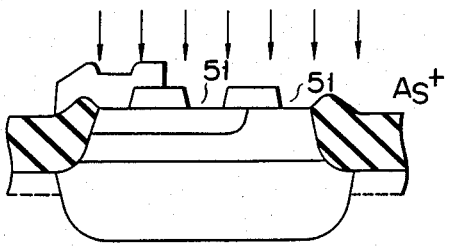
Figure 3C:
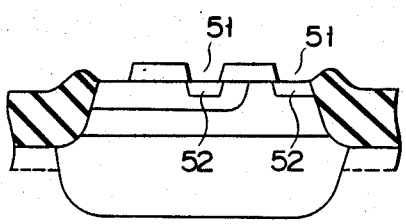
Figure 4:
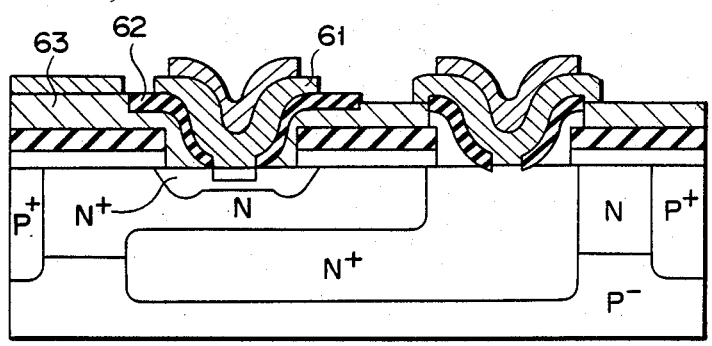
FIG. 4 is a sectional view of a semiconductor device manufactured in accordance with still another conventional method of manufacturing a semiconductor device.

A preferred embodiment of the present invention will be described in detail with reference to the accompanying drawings. In the following explanation, the manufacture of a high-speed bipolar transistor will be depicted.

FIGS. 5A to 5I are sectional views sequentially showing the process of a method of manufacturing a semiconductor device according to the embodiment of the present invention.

Referring to FIG. 5A, reference numeral 1 denotes a p-type wafer; 2, an n-type buried layer; 3, an n-type epitaxial layer; and 4, a p-type element isolation layer. These components are formed in accordance with the conventional process.

In the above state, silicon oxide film 5 (first film) having a thickness of 500 to 3,000 Å is formed on epitaxial layer 3 by thermal oxidation in an $H_2O$ atmosphere. First groove 6 is formed in film 5 by anisotropic etching so as to expose layer 3. Subsequently, a p-type impurity such as B or $BF_2$ is ion-implanted in the exposed portion of layer 3 at an acceleration voltage of $Vac = 40$ keV and at a dose of $Qd = 2 \times 10^{14}$ cm$^{-2}$ thereby forming p-type diffusion layer used for forming a base (FIG. 5A).

A plasma nitride film, more particularly, a silicon nitride film, made of a different material from that of oxide film 5 is deposited on film 5 to a thickness of about 1 μm. Then, first side wall 8 is formed on the side wall of first groove 6 by anisotropic dry etching. Side wall 8 defines second groove 10. Selective etching is performed to form collector contact hole 9. Arsenic is ion-implanted in the surface of p-type diffusion layer 7 and in the surface of epitaxial layer 3 exposed by hole 9 and groove 10 at an acceleration voltage of $Vac = 50$ keV and a dose of $Qd = 5 \times 10^{15}$ cm$^{-2}$ (FIG. 5B).

Tungsten s deposited in hole 9 and second groove 10 to a thickness of 5,000 Å by selective CVD, thereby forming tungsten film 11 (second film) (FIG. 5C).

Figure 5D:
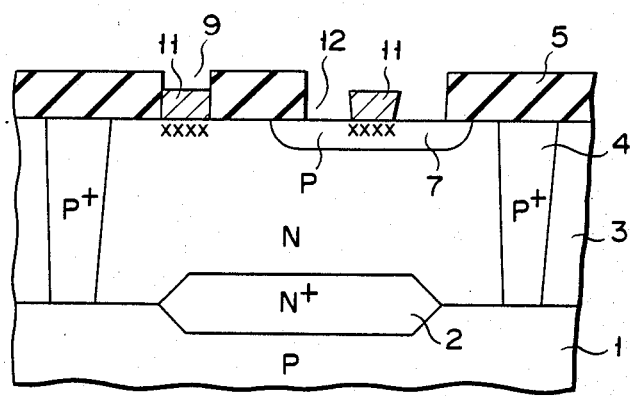

Side wall 8 is washed out by selective wet etching (FIG. 5D). In this case, side wall 8 is made of a plasma nitride film, more particularly, a silicon nitride film made of a different material from that of oxide film 5, as described above. Since side wall 8 is made of a different material as that of film 5, only side wall 8 is removed by wash-out.

A plasma silicon oxide film is deposited on the entire surface of the resultant structure to a thickness of 1 μm. Dry etching is performed to form second side walls 13 on the side wall of third groove 12, defined by tungsten film 11 and oxide film 5, and on the side wall of hole 9. Second side wall 13 is used for formation of a base contact.

Figure 5E:
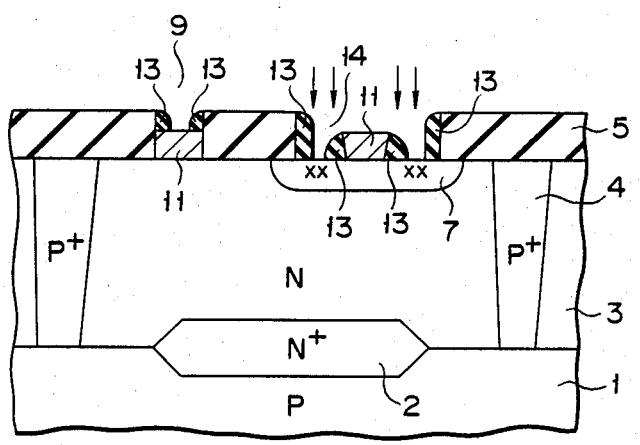

Boron is ion-implanted at an acceleration voltage of $Vac = 40$ keV and at a dose of $Qd = 2 \times 10^{15}$ cm$^{-2}$ to form a base contact (FIG. 5E).

Figure 5F:
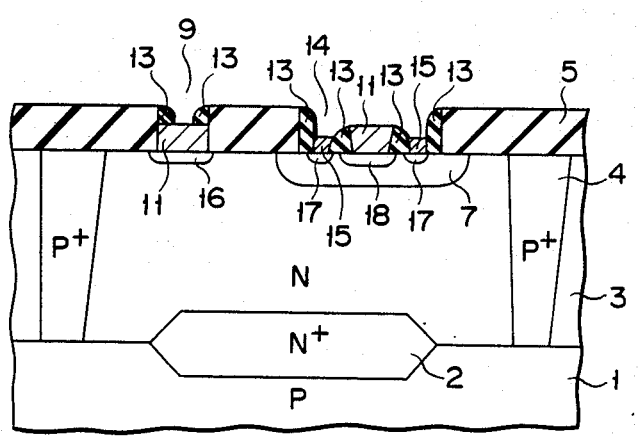

Tungsten is deposited to a thickness of 3,000 Å in fourth groove 14 defined by side wall 13 by selective CVD in the same manner as describe above to form tungsten film 15 (third film). Film 15 must be thinner than tungsten film 11. Therefore, films 11 and 15 do not contact each other over side wall 13. Subsequently, thermal diffusion is performed in an $N_2$ atmosphere at 1,000° C. for 15 minutes, thereby forming diffusion region 16, 17, and 18 of the collector, base, and emitter, simultaneously (FIG. 5F).

Figure 5G:
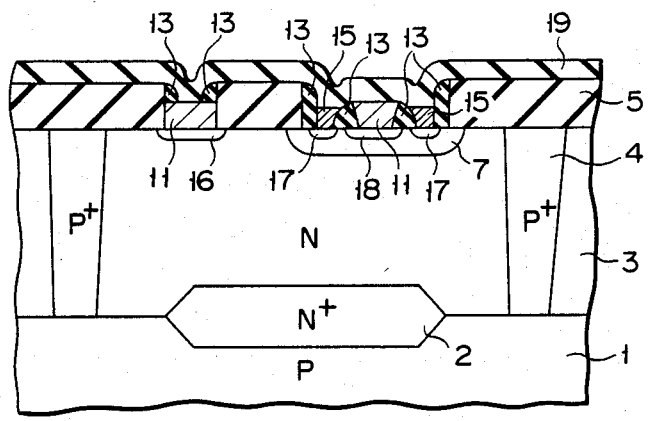

Plasma oxide film 19 having a thickness of 5,000 Å is deposited in the entire surface of the resultant structure (FIG. 5G).

Figure 5H:
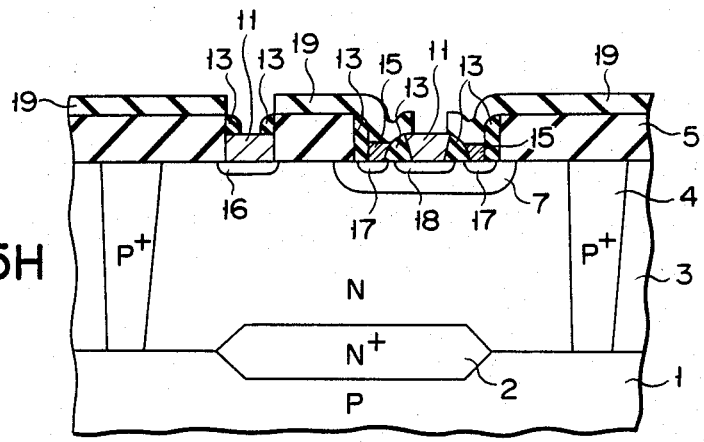

Oxide film 19 is selectively etched for deriving electrodes (FIG. 5H).

Figure 5I:
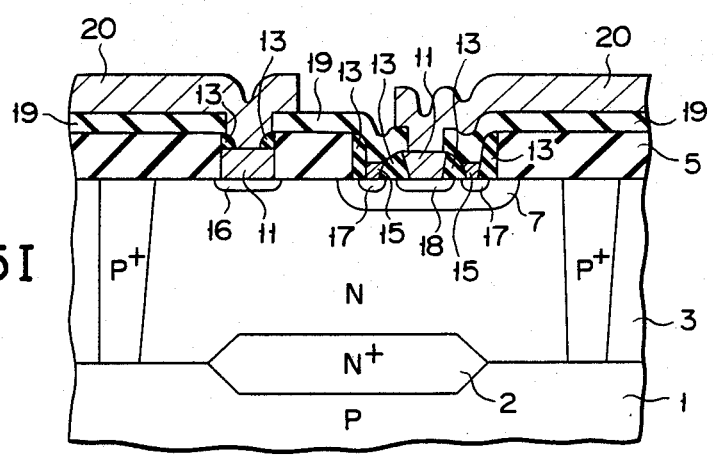

Aluminum is deposited for 1 μm in accordance with the normal process, and wiring 20 is formed by selective etching (FIG. 5I).

Note that the base has an electrode structure as shown in FIG. 6.

The method of manufacturing a semiconductor device according to the present invention has the following basic effects:

(1) Since the junction distance between the base and emitter is determined in accordance with the width of side wall 13, the junction distance between the base contact layer and the emitter contact layer can be decreased without degrading the element characteristics. As a result, a stable, low junction resistance can be obtained.

(2) No extra high-temperature annealing such as thermal oxidation is needed, and the depth of the diffusion profile can be controlled to be small, thus enabling high-speed operation.

(3) The emitter contact is formed by two side wall forming steps. Therefore, no patterning using a fine resist mask is needed to form the side wall.

The present invention also has the following additional effect. More specifically, the method of manufacturing a semiconductor device according to the present invention uses a technique for forming side walls 8 and 13 and a technique for selectively etching grooves 10 and 14 defined by side walls 8 and 13. As a result, the surface of the resultant device can be made flat. In this embodiment, after the base contact is formed, additional film deposition and selective etching are performed, as shown in FIGS. 5F and 5G. If a resist and an etch-back process such as bias sputtering are adopted in the above deposition and selective etching, the surface of the device can be made more flat. In this case, the emitter contact and the collector contact have larger steps than the base contact. Therefore, a contact hole can be automatically formed by an etch back process.

In the embodiment described above, tungsten as a high-melting or refractory metal is deposited on side walls 8 and 13 and in grooves 10 and 14, and the deposited regions are used as contacts also serving as deriving electrodes. However, if silicon containing a high-concentration impurity such as phosphorus or boron is used in place of tungsten and deposited by selective epitaxy, it can be directly used as the diffusion source.

What is claimed is:

1. A method of manufacturing a semiconductor device, comprising:
    a first step of forming a first film on a semiconductor substrate;
    a second step of forming a first groove in said first film;
    a third step of forming a first side wall on a side of said first groove to form a second groove defined by said first side wall;
    a fourth step of forming a second film in said second groove;
    a fifth step of removing said first side wall to form a third groove;
    a sixth step of forming a second side wall on a side of said third groove to form a fourth groove defined by said second side wall; and
    a seventh step of forming a third film in said fourth groove.

2. A method according to claim 1, further comprising, between the second and third steps, a step of forming a diffusion layer of a first conductivity type on a portion of said semiconductor substrate exposed by said first groove formed in the second step.

3. A method according to claim 2, wherein the step of forming said diffusion layer comprises implanting impurity ions of the first conductivity type in the surface of said semiconductor substrate and performing thermal diffusion of the implanted ions.

4. A method according to claim 1, further comprising, between the third and fourth steps, a step of implanting impurity ions of a second conductivity type in a surface of a portion of said semiconductor device exposed by said second groove, and between the sixth and seventh steps, a step of implanting impurity ions of the first conductivity type in a surface of a portion of said semiconductor substrate exposed by said fourth groove.

5. A method according to claim 4, further comprising, after the seventh step, a step of thermally diffusing the impurity ions of the second conductivity type which are implanted in the surface of the portion of said semiconductor substrate exposed by said second groove, and the impurity ions of the first conductivity type which are implanted in the surface of the portion of said semiconductor substrate exposed by said fourth groove.

6. A method according to claim 1, wherein said first film is a silicon oxide film.

7. A method according to claim 1, wherein said first side wall consists of silicon nitride.

8. A method according to claim 1, wherein said second and third films are tungsten films.

9. A method according to claim 1, wherein said second side wall is a silicon oxide film.

10. A method according to claim 1, wherein said second film is thicker than said third film.

11. A method according to claim 1, wherein said second and third film are silicon films containing a conductive impurity.

* * * * *